United States Patent
Cho et al.

(10) Patent No.: US 12,213,387 B2
(45) Date of Patent: Jan. 28, 2025

(54) SPIN-ORBIT TORQUE STRUCTURE INCLUDING TOPOLOGICAL MATERIALS AND MAGNETIC MEMORY DEVICE INCLUDING THE SPIN-ORBIT TORQUE STRUCTURE

(71) Applicants: Samsung Electronics Co., Ltd., Suwon-si (KR); POSTECH Research and Business Development Foundation, Pohang-Si (KR)

(72) Inventors: Won Joon Cho, Suwon-si (KR); Sungdug Kim, Suwon-si (KR); Inseob Shin, Pohang-si (KR); Gilho Lee, Pohang-si (KR); Seong Jang, Pohang-si (KR)

(73) Assignees: Samsung Electronics Co., Ltd., Gyeonggi-do (KR); POSTECH Research and Business Development Foundation, Pohang-si (KR)

(*) Notice: Subject to any disclaimer, the term of this patent is extended or adjusted under 35 U.S.C. 154(b) by 313 days.

(21) Appl. No.: 17/386,187

(22) Filed: Jul. 27, 2021

(65) Prior Publication Data
US 2022/0029090 A1 Jan. 27, 2022

(30) Foreign Application Priority Data

| Jul. 27, 2020 | (KR) | 10-2020-0093379 |
| Mar. 22, 2021 | (KR) | 10-2021-0036758 |
| Jul. 26, 2021 | (KR) | 10-2021-0098114 |

(51) Int. Cl.
*H10N 52/80* (2023.01)
*H10B 61/00* (2023.01)
(Continued)

(52) U.S. Cl.
CPC .............. *H10N 52/80* (2023.02); *H10B 61/00* (2023.02); *H10N 50/85* (2023.02); *H10N 52/00* (2023.02)

(58) Field of Classification Search
CPC ........ H10N 50/85; H10N 52/80; H10N 52/00; H10N 52/85; H10N 52/01; H10N 52/101; H10N 59/00; H10B 61/00
See application file for complete search history.

(56) References Cited

U.S. PATENT DOCUMENTS

| 10,608,169 B2 | 3/2020 | Kim et al. |
| 10,886,457 B2 | 1/2021 | Lee et al. |
| (Continued) | | |

FOREIGN PATENT DOCUMENTS

| CN | 109904291 A | 6/2019 |
| KR | 10-1873695 B1 | 7/2018 |
| KR | 10-2019-0063641 A | 6/2019 |

OTHER PUBLICATIONS

Qin, Anamalous Hall Effect, Robust Negative Magnetoresistance, and Memory Devices Based on a Noncollinear Antiferromagnetic Metal, Apr. 2020, ACS Nano 2020,14, 6242-6248.*

(Continued)

*Primary Examiner* — Latanya N Crawford Eason
(74) *Attorney, Agent, or Firm* — Harness, Dickey & Pierce, P.L.C.

(57) ABSTRACT

The present disclosure provides a spin-orbit torque structure having a high spin Hall angle and low resistance by including a topological material. In addition, the present disclosure provides a spin-orbit torque structure having a low power consumption density by including a topological material. Also, a magnetic memory device including the spin-orbit torque structure is provided.

20 Claims, 6 Drawing Sheets

(51) Int. Cl.
    *H10N 50/85*     (2023.01)
    *H10N 52/00*     (2023.01)

(56) References Cited

U.S. PATENT DOCUMENTS

| | | |
|---|---|---|
| 2014/0269036 A1 | 9/2014 | Pi et al. |
| 2017/0316813 A1 | 11/2017 | Lee et al. |
| 2020/0006636 A1 | 1/2020 | Gosavi et al. |
| 2020/0006643 A1* | 1/2020 | Gosavi ............... H01F 10/3286 |
| 2020/0279992 A1* | 9/2020 | Pham .................... H10N 52/00 |
| 2020/0395532 A1* | 12/2020 | Cai ....................... H10N 50/10 |
| 2022/0060149 A1* | 2/2022 | Pham .................... H10N 50/85 |
| 2023/0276637 A1* | 8/2023 | Xing ..................... H10N 52/85 |
| | | 257/421 |

OTHER PUBLICATIONS

Samsung Best Paper Award 2020, "Topological Semi-metals based High-performance Spin-orbit Torque Device."

Atsufumi Hirohata et al., "Review on spintronics: Principles and device applications," Journal of Magnetism and Magnetic Materials 509, 166711, Mar. 9, 2020.

Y. Fan et al., "Magnetization switching through giant spin-orbit torque in a magnetically doped topological insulator heterostructure," Nature Materials, vol. 13, pp. 699-704, Apr. 28, 2014.

G. Yu et al., "Switching of perpendicular magnetization by spin-orbit torques in the absence of external magnetic fields," Nature Nanotechnology, vol. 9, pp. 548-554, May 11, 2014.

\* cited by examiner

SPIN-ORBIT TORQUE STRUCTURE INCLUDING TOPOLOGICAL MATERIALS AND MAGNETIC MEMORY DEVICE INCLUDING THE SPIN-ORBIT TORQUE STRUCTURE

CROSS-REFERENCE TO RELATED APPLICATIONS

This application is based on and claims priority under 35 U.S.C. § 119 to Korean Patent Application Nos. 10-2020-0093379, filed on Jul. 27, 2020, 10-2021-0036758, filed on Mar. 22, 2021, and 10-2021-0098114, filed on Jul. 26, 2021 in the Korean Intellectual Property Office, the disclosures of each of which are incorporated by reference herein in their entirety.

BACKGROUND

1. Field

The present disclosure relates to a spin-orbit torque structure including a topological material and a magnetic memory device including the spin-orbit torque structure. Magnetic memory devices may be used for magnetoresistive random access memory (MRAM), for example, in spin-orbit torque (SOT) MRAM.

2. Description of the Related Art

A ferromagnetic material refers to a material that is spontaneously magnetized even without the application of a strong external magnetic field. In a magnetic tunnel junction (MTJ) structure in which an insulator is inserted between two ferromagnetic materials (first magnetic material/insulator/second magnetic material), a tunneling magnetoresistance effect occurs, that is, an electrical resistance varies with relative magnetization directions of two magnetic materials. The tunneling magnetoresistance (TMR) effect occurs because the flow of up-spin and flow of down-spin electrons through the insulator are different from each other in the magnetic tunnel junction structure.

In magnetoresistive random access memory (MRAM) using a difference in a tunneling magnetic resistance (TMR), a magnetic resistance difference is generated as the magnetization directions of a free magnetic layer and a pinned magnetic layer of the MRAM are parallel or antiparallel to each other. For example, the parallel magnetization directions may indicate "0" in terms of data due to low resistance, and/or the antiparallel magnetization may indicate "1" in terms of data due to high resistance.

Recently, magnetic memories are applied according to a driving operation in which the magnetization of a free layer to be parallel or antiparallel with respect to the magnetization of a pinned layer by using a spin-transfer torque (STT) and/or a spin-orbit torque (SOT) generated inside the MTJ (e.g., instead of using an external magnetic field applied from a periphery of the MTJ).

MRAM is nonvolatile memory using a tunneling magnetoresistance effect, and has the advantages of high speed, low power, and high durability compared to other SRAM, PRAM, E-Flash, etc. However, in the case of previously developed STT-MRAM, it is difficult to achieve ultra-high speed (switching speed <1 ns) and low power consumption (switching energy <1fJ) due to structural and principle limitations. Thus, SOT-MRAM has been proposed as an alternative.

In SOT-MRAM, when a charge current flows in a wire adjacent to the free magnetic layer, MTJ may induce magnetization switching of a free magnetic layer by using spin-orbit torque (SOT) generated by a spin current generated by spin Hall effect and/or Rashba effect.

In SOT-MRAM of the related art, a method of using heavy metals (HMs), such as Pt, Ta, etc. has been considered, but these HMs have very low efficiency for forming a spin current. Thus, it is very difficult to manufacture high-performance SOT-MRAM for actual commercialization.

SUMMARY

Provided are spin-orbit torque structures having a high spin Hall angle while a spin-orbit torque of a magnetic memory device including a heavy metal has a low spin Hall angle, and at the same time, having a lower resistance than an insulator by including a topological material.

Provided are spin-orbit torque structures capable of operating at low power due to a low power consumption density by including a topological material.

Provided are magnetic memory devices including a spin-orbit torque structure.

Additional aspects will be set forth in part in the description which follows and, in part, will be apparent from the description, or may be learned by practice of the presented embodiments of the disclosure.

According to an aspect of an embodiment, a spin-orbit torque structure includes an electrode layer including a two-dimensional topological material; and a free magnetic layer in contact with the electrode layer, the free magnetic layer including a ferromagnetic material, and configured to be magnetically switched by receiving a spin-orbit torque by the spin current.

The two-dimensional topological material may include at least one of a topological insulator (TI) or a topological semi-metal (TSM).

For example, the topological insulator may include at least one of $Bi_xSe_{1-x}Sb_yTe_{1-y}$ (BSTS), $Bi_2Te_2Se$ (BTS), or $Bi_2Se_2Te$ (BST).

For example, the topological semi-metal may include at least one of $WTe_2$, $ZrTe_5$, $EuMnBi_2$, or $CaIrO_3$.

Also, the ferromagnetic material may have a perpendicular magnetic anisotropy (PMA).

Also, the ferromagnetic material may have a Curie temperature in a range of about 130 K to about 330 K.

For example, the ferromagnetic material may include at least one of $Fe_3GeTe_2$ (FGT), CrGeTe (CGT), or CrSiTe (CST).

Also, the spin-orbit torque structure may have a spin Hall angle $\theta_{SH}$ of 0.2 or more.

Also, the spin-orbit torque structure may have a power density of 20 W/m³ or less.

An interface between the electrode layer and the free magnetic layer may be atomically flat.

Also, the spin-orbit torque structure may include only the two-dimensional topological material and the ferromagnetic material.

A critical switching charge current density at which the magnetization switching is performed may be $10^7$ A/cm² or less.

Also, at least one of the topological material and the ferromagnetic material may be a van der Waals (vdW) material.

For example, the two-dimensional topological material and/or the ferromagnetic material may each comprise a stack of two-dimensional layers.

Also, the spin current may be generated by a spin Hall effect.

According to an aspect of an embodiment, a memory device includes: the spin-orbit torque structure described above; a pinned magnetic layer; and a tunnel barrier between the free magnetic layer of the spin-orbit torque structure and the pinned magnetic layer, wherein the memory device is configured to change magnetoresistance according to the magnetization switching of the free magnetic layer.

The memory device may be configured to have conductance across the tunnel barrier when a magnetization direction of the free magnetic layer is parallel to a fixed magnetization direction of the pinned magnetic layer and/or to have resistance across the tunnel barrier when a magnetization direction of the free magnetic layer is antiparallel to a fixed magnetization direction of the pinned magnetic layer.

The tunnel barrier may include an oxide of at least one of magnesium (Mg), titanium (Ti), aluminum (Al), magnesium oxide (MgO), magnesium-zinc (MgZn), and magnesium-boron (MgB), and a nitride of titanium (Ti) and vanadium (V).

Also, the pinned magnetic layer may include Fe, Co, Ni, or an alloy thereof, for example, at least one of NiFe, CoFe, NiFeB, CoFeB, NiFeSiB or CoFeSiB.

According to an aspect of an embodiment, an electronic apparatus includes the magnetic memory device described above.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
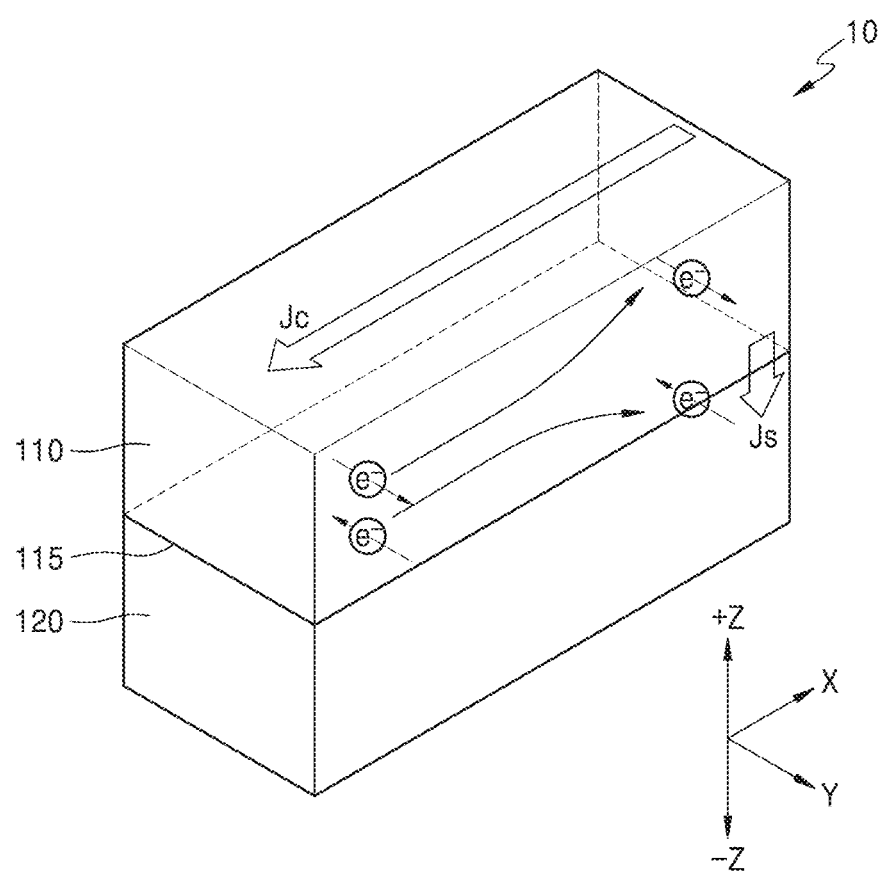
FIG. 1 is a schematic diagram showing a spin-orbit torque (SOT) structure according to some example embodiments.

Reference will now be made in detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. The embodiments of the inventive concept are capable of various modifications and may be embodied in many different forms. In the drawings, like reference numerals refer to the like elements and sizes of constituent elements may be exaggerated for clarity and convenience of explanation.

It will be understood that when an element or layer is referred to as being "on" or "above" another element or layer, the element or layer may be directly on another element or layer or intervening elements or layers.

Singular forms are intended to include the plural forms unless the context clearly indicates otherwise. It should be understood that, when a part "comprises" or "includes" an element in the specification, unless otherwise defined, it is not excluding other elements but may further include other elements.

The term "above" and similar directional terms may be applied to both singular and plural. It will be understood that the directional terms are intended to encompass different orientations of the device in use or operation in addition to the orientation depicted in the figures. For example, the device may be otherwise oriented (rotated 90 degrees or at other orientations) and the directional terms used herein interpreted accordingly.

When the terms "about," "approximately," and/or "substantially" are used in this specification in connection with a numerical value, it is intended that the associated numerical value includes a manufacturing tolerance (e.g., ±10%) around the stated numerical value. It will be understood that these values should be construed as including a manufacturing or operational tolerance (e.g., ±10%) around the stated numerical values.

All example terms ("for example", "e.g.", etc.) are simply used to explain in detail the technical scope of the inventive concept, and thus, the scope of the inventive concept is not limited by the example terms as long as it is not defined by the claims.

FIG. 1 is a schematic diagram showing a spin-orbit torque (SOT) structure 10 according to some example embodiments.

The SOT structure 10 includes: an electrode layer 110 including a topological material stacked in a two-dimensional layered structure and generating a spin current (e.g., by spin Hall effect), and a free magnetic layer 120 in contact with the electrode layer 110, including a ferromagnetic material stacked in a two-dimensional layered structure, and magnetically switched by receiving a SOT (e.g., by a spin current).

The topological material included in the electrode layer 110 may be a van der Waals Material (vdW Material) having a two-dimensional layered structure. Also, the ferromagnetic material included in the free magnetic layer 120 may be a van der Waals material having a two-dimensional layered structure. The SOT structure 10 including the topological material (e.g., which is a van der Waals material) and the ferromagnetic material (e.g., which is a van der Waals material) may comprise a SOT structure including, as a whole, only van der Waals material and may be referred to as a "full-vdW".

In some embodiments, the electrode layer 110 may include a layered structure of N-fold (where N is a natural number greater than or equal to 1) of a topological material having a two-dimensional layered structure, and the free magnetic layer 120 may include a layered structure of M-fold (where M is a natural number greater than or equal to 1) of a ferromagnetic material having a two-dimensional layered structure. The electrode layer 110 and the free magnetic layer 120 may each comprise a single layer and/or multiple layers. One layer of the electrode layer 110 and one layer of the free magnetic layer 120 may be in contact with each other, for example at an interface 115.

The spin Hall effect may denote a phenomenon in which a movement direction (e.g., the direction which the electrons flow through, for example, a wire) of electrons, having a spin, is shifted according to a spin direction, and as a result, spin-accumulation occurs in a lateral direction of the wire when an electric charge flows, e.g., when a charge current (hereinafter, a current) flows. For example, in the case of an up spin, spins may be accumulated in one direction, and in the case of a down spin, spins may be accumulated in a direction opposite to the one direction. For ease of explanation, the spin Hall effect (e.g., in quantum physics) may be considered to correspond to Hall effect in classical physics.

When electrons having spins having opposite directions are accumulated in opposite directions, there is no change in charge according to the movement of electrons (Δq=0). Instead, it may be said that one spin direction accumulates in one direction, and/or that a spin current flows. When a spin current flows and/or the electrons with a spin opposite to the direction of magnetic dipole inside the ferromagnetic material are accumulated in a direction of the ferromagnetic material, the direction of the magnetic dipole in the ferromagnetic material (e.g., the direction of magnetization) may be changed by the SOT.

Referring to FIG. 1, when a current (at this time, current density is $J_c$) flows in an (−) x-axis direction of the electrode layer 110, electron with spin polarized in a positive (+) y-axis direction may move in a positive (+) z-axis direction, and electron with spin polarized in a negative (−) y-axis direction may move in a negative (−) z-axis direction due to spin Hall effect generated inside the electrode layer 110. At this point, because electrons having spins in different directions respectively move in different directions, there is no total charge movement. For example, there may be no current flow caused by the electrons, and it may be said that a spin current (current spin density at this time is $J_s$) is generated (e.g., a spin polarized in the y-axis direction move in the z-axis direction). Accordingly, spins may accumulate at the interface 115 where the electrode layer 110 and the free magnetic layer 120 contact each other. At this time, the spin polarization direction of spin accumulated at the interface 115 is the (−) y-axis direction, and the spin polarization direction of spin accumulated on an upper surface of the electrode layer 110 is the (+) y-axis direction.

The spin accumulation at the interface 115 between the electrode layer 110 and the free magnetic layer 120 applies a spin torque to a ferromagnetic material of the free magnetic layer 120. Because the spin Hall effect is caused by a strong spin-orbit coupling (SOC), a spin-torque generated therefrom it may be referred to as a spin-orbit torque (SOT). Spins may change the direction of a magnetic dipole by applying a spin-orbit torque to a ferromagnetic material, which is referred to as 'switching'.

In this way, the principle of a SOT is that a spin current is generated by flowing a current through a conductive wire (e.g., the electrode layer 110 in the above embodiment) in contact with the free magnetic layer 120, and the magnetization direction of the ferromagnetic material of the free magnetic layer 120 is switched according to the SOT caused by the accumulation of spin. The free magnetic layer 120 may have a magnetization direction parallel to a pinned magnetic layer (not shown) with a fixed magnetization direction and/or an antiparallel magnetization direction, and thus, may function as an MRAM, and this may be referred to as SOT-MRAM.

The topological material may have a high generation-efficiency of a spin current (hereinafter, a spin Hall angle $\theta_{SH}$) compared to a current being flowed by a topological twist of a unique energy band. The topological material may include at least one of a topological insulator (TI) and/or a topological semi-metal (TSM).

The topological insulator acts like an insulator to current traversing through (e.g., inside) the topological insulator because no current flows inside the topological insulator. However, because a current may flow across (e.g., on and/or over) a surface of the topological insulator (due to the unique energy band of the topological insulator) the surface acts like a conductor to current attempting to traverse across the surface. Thus, the topological insulator may be referred to as having a spin polarized surface state. In some embodiments, this may be because a Fermi surface of the topological insulator appears as a point-like intersection of a valence band and a conduction band. Because a current may flow through its surface, a topological insulator may have a relatively lower resistance than a general insulator and may have a high spin Hall angle, while a general insulator (e.g., having a very high resistance) even when having a high spin-Hall angle, will consume a large amount of power, so may not be suitable for use as a magnetic memory device.

In some embodiments, the topological insulator may include, for example, at least one of $Bi_xSe_{1-x}Sb_yTe_{1-y}$ (BSTS) (where x is 0, 1 or a value between 0 and 1)(where y is 0, 1 or a value between 0 and 1), $Bi_2Te_2Se$ (BTS), $Bi_2Se_2Te$ (BST), and/or the like.

Unlike a topological insulator, in a topological semi-metal current may flow not only on a surface thereof but also inside a bulk thereof. In some embodiments, this is because a Fermi surface of the topological semi-metal, at an intersection of a valence band and a conduction band, appears in the form of a line and/or a plane rather than as a point. Accordingly, the topological semi-metal may have both characteristics of a high spin Hall angle and low resistance (and/or high conductivity). As a result, when the magnetization of the topological semi-metal is switched, the magnetization switching may be driven with a lower power consumption than when a topological insulator or a heavy metal is used. Therefore, a magnetic memory device including the topological semi-metal may have significantly higher efficiency than a magnetic memory device including a heavy metal such as Pt, Ta, etc.

In some embodiments, the topological semi-metal may include, for example, at least one of $WTe_2$, $ZrTe_5$, $EuMnBi_2$, $CaIrO_3$, $SrAs_3$ and/or the like.

When a current flows through the electrode layer 110, a resulting spin current applies a SOT to the ferromagnetic material, and thus, the magnetization direction of the ferromagnetic material may be switched.

A ferromagnetic material is a material magnetized in a certain direction. The ferromagnetic material may be and/or include a van der Waals material having a two-dimensional layered structure. For example, the two-dimensional layered structure may include a plurality of two-dimensional material layers, which may each include various elements, units, and/or compounds arranged in a two-dimensional lattice. The term two-dimensional material is in contrast to, e.g., a zero-dimensional (0 D) material (e.g., a quantum dot), a one-dimensional material (e.g., a nanowire), and/or a three-dimensional (3 D) material. For example, in contrast to a two-dimensional material, the 3 D material may be considered to comprise elements and/or compounds arranged in a 3 D structure and/or lattice. In the two-dimensional layered structure, interlayers of the two-dimensional material may be bonded by van der Waals forces, and thus the material comprising the structure may be referred to as a van der Waals material.

In some embodiments, the ferromagnetic material may have a perpendicular magnetic anisotropy (PMA) perpendicular to an atomic layer of the two-dimensional layered structure. For example, the PMA may be perpendicular to the plane formed by a layer of (and/or the average planes of) the two-dimensional layered structure. For example, $Fe_3GeTe_2$ (FGT) is a material that may represent one of a van der Waals material family, and that may have a PMA even in a single layer structure.

In some embodiments, the ferromagnetic material may include, for example, at least one of $Fe_3GeTe_2$ (FGT), CrGeTe (CGT), CrSiTe (CST), and/or the like. In addition, the ferromagnetic material may include material having a PMA, such as Co, CoFeB, CoTb, etc.

In each ferromagnetic material, at a temperature greater than the Curie temperature $T_c$, each magnetic dipole has a random direction, and thus, the ferromagnetic material loses its magnetization. Therefore, the greater the Curie temperature $T_c$ of a ferromagnetic material is, the more suitable for the commercialization of the ferromagnetic material. For example, FGT, in a single crystal state, not only has a Curie temperature $T_c$ as high as about 230 K, but also FTG in a single layer has a Curie temperature of as high as about 130 K, which is high compared to a single layer of other van der Waals materials. In addition, when an electrostatic gating is used, the Curie temperature $T_c$ of FGT may be increased to room temperature. Such a high Curie temperature $T_c$ may allow the FGT to act as a strong point in commercialization of SOT-MRAM.

In addition, because several layers of FGT film may be grown by a molecular beam epitaxy (MBE) process, there is an advantage in that a wafer-scale single-layer full-vdW SOT structure may be readily manufactured.

In order to realize a magnetic memory device having a high spin Hall angle and low consumption power density, not only the selection of a topological material (e.g., low resistance, spin Hall angle, etc.) and the selection of a ferromagnetic material (e.g., Curie temperature, spin Hall angle, etc.) may be important, and also the combination of the two materials (e.g., spin Hall angle, etc.) and the quality of the interface 115 between the materials (e.g., spin Hall angle, SOT scattering, etc.) may be important. Related content will be described below.

Figure 2A:
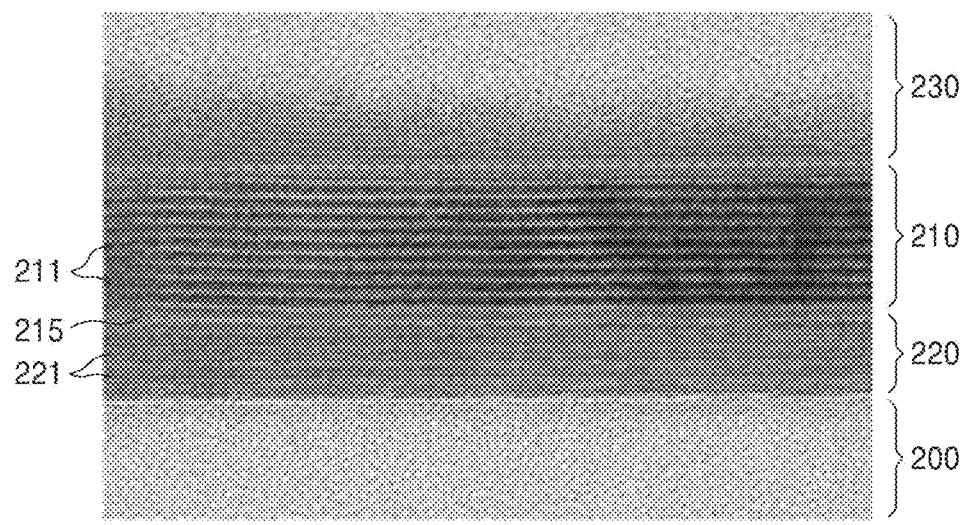
FIG. 2A is a micrograph showing a SOT structure according to an embodiment.
Figure 2B:
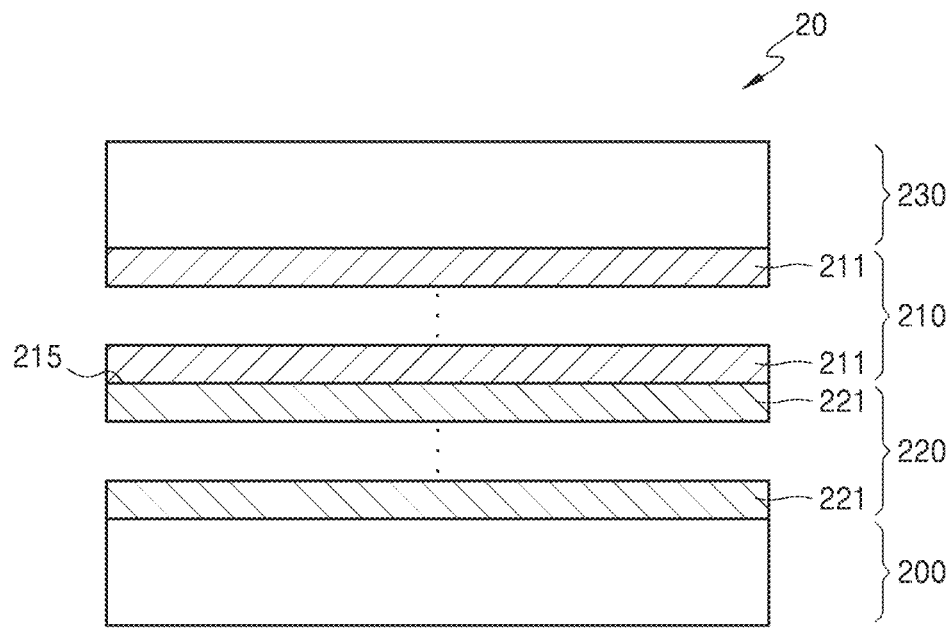
FIG. 2B is a cross-sectional view of a SOT structure according to some example embodiments.
Figure 3:
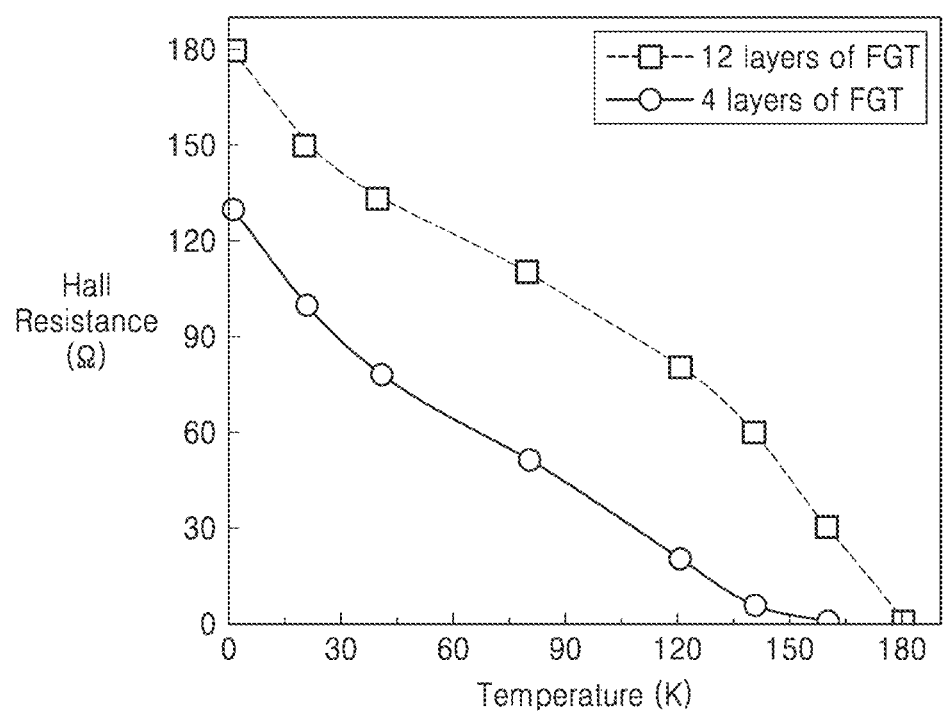
FIG. 3 is a graph showing a relationship between temperature and Hall resistance in a quadruple or 12-layer of a FGT layer.

FIG. 2A is a micrograph showing a SOT structure in which a free magnetic layer 220, which is a FGT 6-fold layer (4.8 nm) 221, and an electrode layer 210, which is a $WTe_2$ 11-fold layer (7.7 nm) 211, are stacked on a substrate 200 according to an embodiment. FIG. 2B is a cross-sectional view of a SOT structure 20 in which a free magnetic layer 220 including a plurality of FGT layers 221, an electrode layer 210 including a plurality of $WTe_2$ layers 211, and a capping layer 230 are stacked on the substrate 200 according to some example embodiments. FIG. 3 is a graph showing a relationship between temperature and Hall resistance in a FGT 4-fold layer and a FTG 12-fold layer.

$WTe_2$ and FGT may be van der Waals materials having a two-dimensional layered structure, and in this case, may be stacked through a focused ion beam (FIB). The thickness of each of the $WTe_2$ single layers 211 may be approximately 0.7 nm, and the thickness of each of the FGT single layers 221 may be approximately 0.8 nm.

According to FIG. 2A, the free magnetic layer 220 includes the FGT 6-fold layer 221, but is not limited thereto. For example, the free magnetic layer 220 may include a single layer 221, and/or, referring to FIG. 2B, may include N-fold layer(s) 221 (where N is a natural number greater than or equal to 1). A Hall resistance and Curie temperature $T_c$ may be determined according to the number of the plurality of layers 221 of the FGT. FIG. 3 shows Hall resistance values at a temperature in a range from about 1.8 K to about 200 K. At 1.8 K, the FGT may exhibit a strong perpendicular magnetic anisotropy, and as the temperature increases, the perpendicular magnetic anisotropy weakens and is lost at about 160 K in the case of the FGT 4-fold layer and at about 180 K in the case of the FGT 12-fold layer. The Hall resistance has a pattern that approaches 0 ohms (0) as the temperature increases. As N increases, the Hall resistance may have a greater value at the same temperature. As N increases, the Curie temperature $T_c$ may have a higher value. As the Curie temperature $T_c$ of the SOT structure 20 increases, the Hall resistance decreases, and a driving current may also decrease.

According to FIG. 2A, the electrode layer 210 is illustrated as a $WTe_2$ 11-fold layer 211, but is not limited thereto. For example, the electrode layer 210 may be a single layer 211, and/or, referring to FIG. 2B, may include M-fold layer(s) 211 (where M is a natural number greater than or equal to 1). When the electrode layer 210 is stacked on the free magnetic layer 220, an interface 215 may be formed. In this case, the interface 215 between the electrode layer 210 and the free magnetic layer 220 may be atomically flat. For example, the atomically flat interface 215 may denote that the interface 215 is flat as the interface 215 between the two-dimensional layered structures 211 and 221, only a material of the electrode layer 210 may contact a material of the free magnetic layer 220 at the interface 215, and does not include other materials besides the materials described above. Here, the other materials may include a reactant of the material of the electrode layer 210 or the material of the free magnetic layer 220, and/or a reactant of the materials of the electrode layer 210 or the free magnetic layer 220 with an external material, such as oxygen or water vapor in the air. For example, the electrode layer 210 and the free magnetic layer 220 may generate a two-dimensional interface 215, such that atoms of a topological material and atoms of a ferromagnetic material do not chemically react with each other at the interface 215 and are in a state in which each of the atoms does not chemically react with external materials, such as oxygen or water vapor in the air. If such a chemical reaction does not occur, it may be said that the interface 215 has an "atomically" flat structure. In some embodiments, the two-dimensional materials selected for the electrode layer 210 and the free magnetic layer 220 may be selected based on their chemical reactivity (and/or a lack thereof) with each other.

At this time, to prevent a chemical reaction with oxygen or water vapor in the air when the SOT structure 20 is stacked, the free magnetic layer 220 and the electrode layer 210 may be stacked under a vacuum or inert gas (e.g., a Group 18 gas) atmosphere. For example, the stacking of the free magnetic layer 220 and the electrode layer 210 may be performed in a glove box under an argon (Ar) atmosphere, and at this time, contact with air and foreign materials may be avoided. Accordingly, the free magnetic layer 220 and the electrode layer 210 each do not form a reactant therefrom and do not react with each other, and thus, the interface 215 may be atomically flat.

If the interface 215 between the topological material and the ferromagnetic material is not atomically flat and/or includes other materials, a SOT scattering, which is a phenomenon in which directions of spins are distorted or scattered outside a desired direction, may occur on the interface 215. When the SOT scattering occurs, the SOT may not be properly applied to the free magnetic layer 220 (e.g., due to the SOT scattering even when the same current flows), and thus, a spin Hall angle may decrease.

In order to have an atomically flat interface 215, after stacking the FGT layer 221 (which in some embodiments may easily react with external materials on the substrate 200) the $WTe_2$ layer 211 may be stacked. Also, afterwards, in order to minimize a reaction, the electrode layer 210 may be covered by the capping layer 230, and thus, the SOT structure 20 may be protected.

Referring to FIG. 2B, the SOT structure 20 according to some example embodiments has the atomically flat structure of the interface 215 and includes only $WTe_2$ as a topological material and FGT as a ferromagnetic material. When a current flows through the $WTe_2$ and/or FGT, electrons in the $WTe_2$ may move up/down according to a spin, thus, a spin current is caused. Spins in one direction are accumulated on a lower surface of $WTe_2$ by the spin current, and accordingly, the magnetization direction of FGT may be switched.

In this case, in order to construct a good magnetic memory device, the SOT structure 20 of the magnetic memory device should have a high spin Hall angle and the electrode layer 210 should have a low electrical resistance. For example, if the spin Hall angle is high and the electrical resistance of the electrode layer 210 is low, a driving current for driving the magnetic memory device is also low, and thus, efficiency in terms of power may be increased. In this case, the spin Hall angle $\theta_{SH}$ is expressed by Equation 1 below.

$$\theta_{SH} = \frac{J_s}{J_c} \quad \text{[Equation 1]}$$

Here, $J_s$ denotes spin current density, and $J_c$ denotes current density.

For a high spin Hall angle, the properties of a topological material and a ferromagnetic material may be important, and a combination of the topological material and the ferromagnetic material may also be important. In addition, because less SOT scattering should occur, the interface 215 may be atomically flat.

In order to construct a good magnetic memory device, the SOT structure of the magnetic memory device may have high power efficiency, that is, a low consumption power density. The power consumption density, which may be expressed as $W/m^3$ (watts per cubic meter) is expressed by Equation 2 below.

power density$(W/m^3)=J_{sc}^2 \cdot P$ Equation 2

Here, $J_{Sc}$ denotes a critical switching charge current density, and p denotes specific resistance of the electrode layer 210. $J_{Sc}$ is a critical current density capable of switching the magnetization direction of the free magnetic layer 220. The low consumption power density denotes that a driving power is low. For low consumption power density, a topological material having a low resistivity may be selected. Also, for low consumption power density, a topological material and a ferromagnetic material having a low critical switching current density may be selected (e.g., this may denote that, because a current density required to produce the same spin current density is low, the selection of a material having a high spin Hall angle and a combination of the materials is necessary).

Comparative measurement results between samples according to an example embodiment and a comparative example with respect to the spin Hall angle and consumption power density are in Table 1.

TABLE 1

| | Electrode layer | Free magnetic layer | $\theta_{SH}$ | power density $(W/m^3)$ |
|---|---|---|---|---|
| Embodiment | $WTe_2$(12.6 nm) | FGT(7.2 nm) | 7.2 | 6.7 |
| Comparative example | Pt(3.0 nm) | Co(0.7 nm) | 0.01 | 63 |

According to Table 1, the SOT structure 20 of a combination of the $WTe_2$ 18-fold layer 211/FGT 9-fold layer 221 shows a very high value of spin Hall angle $\theta_{SH}$ of 7.2. The SOT structure 20 may have an efficiency of about 720 times greater compare to the value of $\theta_{SH}$ of a SOT structure of a Pt/Co combination in which the electrode layer, according to the comparative example, is 0.01. Also, the power consumption density according to an embodiment is 6.7 $W/m^3$. The power consumption density is about 10 times lower than the value of 63 $W/m^3$, which is a value of the SOT structure of the Pt/Co combination according to the comparative example, and thus, a magnetic memory device may be operated with a low power through the SOT structure 20 according to the example embodiment. This is because, though the heavy metal (Pt) has a lower resistance than the topological semi-metal ($WTe_2$), the efficiency of generating a spin current (e.g., a spin Hall angle) is extremely low.

Figure 4:
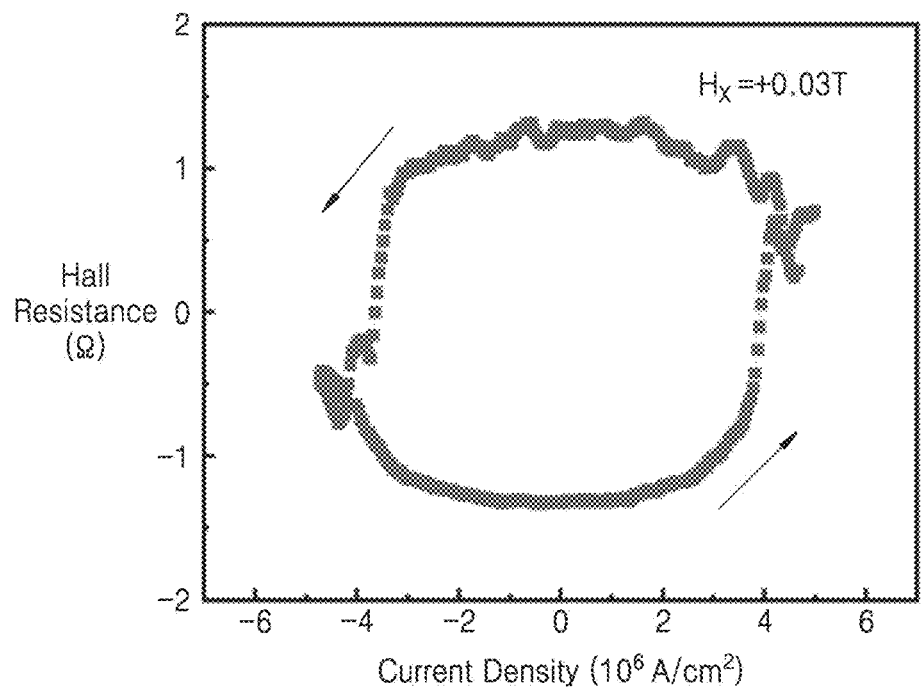
FIG. 4 is a graph showing a $WTe_2$/FGT current density-Hall resistance according to an example embodiment.
Figure 5:
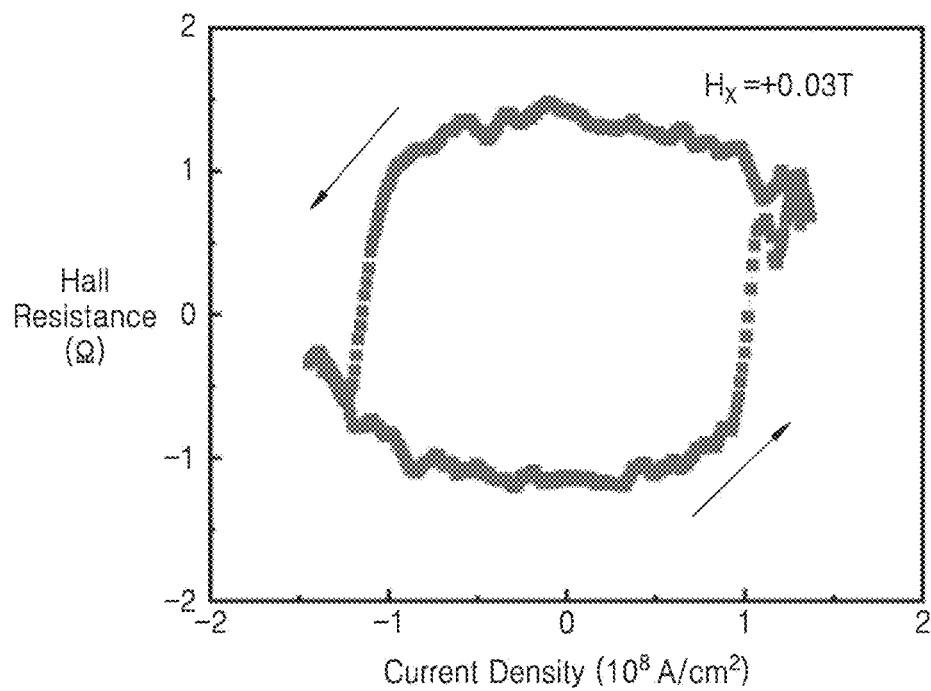
FIG. 5 is a graph showing a Pt/Co current density-Hall resistance according to a comparative example.

FIG. 4 is a graph of $WTe_2$/FGT current density-Hall resistance according to an embodiment, and FIG. 5 is a graph of Pt/Co current density-Hall resistance according to a comparative example.

Referring to FIG. 4, in order to measure the SOT structure 20 of a combination of $WTe_2$ 18-fold layer 211/FGT 9-fold layer 221, a magnetic field of 0.03 T was applied to the SOT structure 20 in an x-axis direction through which a current flows, and, in this case, an absolute value of a current at which the Hall resistance value switches from negative to positive and/or from positive to negative may be referred as a critical switching current density, which has a value of approximately $3.9 \times 10^6$ $A/cm^2$. On the other hand, referring to FIG. 5, a magnetic field of 0.03 T was applied to a SOT structure in an x-axis direction through which a current flows to measure the SOT structure of a Pt/Co combination according to the comparative example, and it may be said that the critical switching current density has a value of about $10^8$ $A/cm^2$. That is, the SOT structure 20 including the topological structure (e.g., the $WTe_2$/FGT combination) may implement a much more (e.g., several magnitudes more) efficient magnetic memory device when compared to the SOT structure including just a heavy metal combination (e.g., the Pt/Co combination). For example, the critical switching current density of the SOT structure 20 according to some example embodiments may be about $10^7$ A/cm$^2$ or less.

As described above, as a spin Hall angle of the SOT structure 10 and/or 20 (e.g., including the WTe$_2$/FGT combination) is high and electrical resistance is low, a magnetic memory device, including the SOT structure 10 and/or 20, may have a low critical switching current density and low power consumption density. As the critical switching current density is low and the power consumption density is low, ultra-high speed, low power consumption, and/or efficient conversion of current and spin current are also possible, and thus, the magnetic memory device may be used in next-generation spin memory devices, such as spin logic devices and spin transistors. In some example embodiments, these spin memory devices may also be used to fabricate a topologically stable qubit, and thus may be utilized in a quantum computer.

Figure 6:
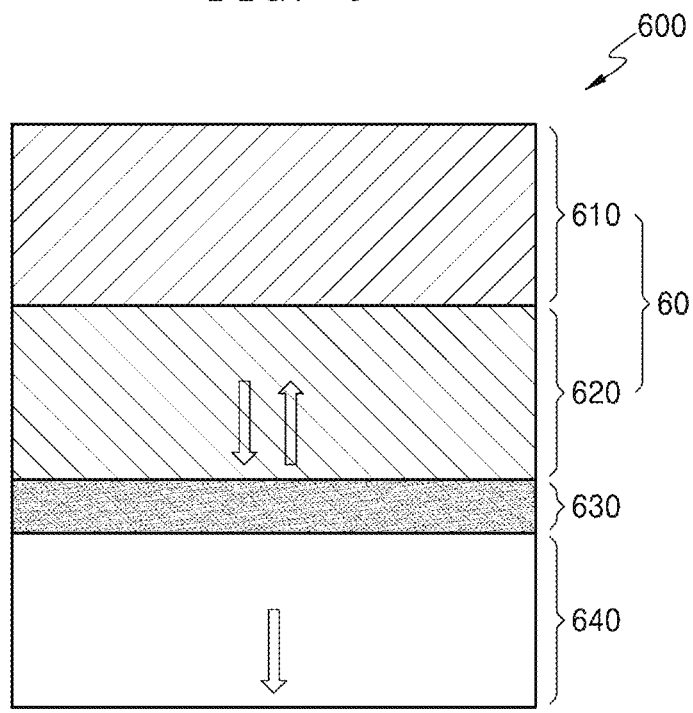
FIG. 6 is a schematic diagram illustrating a spin-orbit torque magnetic memory device (SOT-MRAM) including a SOT structure according to some example embodiments.

FIG. 6 is a schematic diagram illustrating a magnetic memory device (SOT-MRAM) 600 including a SOT structure 60.

An SOT structure 60 of the magnetic memory device 600, according to some example embodiments, includes an electrode layer 610 including a topological material stacked in a two-dimensional layered structure (as described above) and generating a spin current by a spin Hall effect, and a free magnetic layer 620 in contact with the electrode layer 610, including a ferromagnetic material stacked in a two-dimensional layered structure (as described above), and magnetically switched by receiving a SOT by the spin current.

The magnetic memory device 600 according to some example embodiments may further include a tunnel barrier 630 arranged under the free magnetic layer 620, and a pinned magnetic layer 640 arranged under the tunnel barrier 630. A magnetization switching may occur due to the SOT described above, and a tunneling magnetic resistance (TMR) may be changed according to the magnetization switching.

The tunnel barrier 630 having a predetermined (and/or otherwise desirable) thickness may be arranged under the free magnetic layer 620. The tunnel barrier 630 may have a thickness less than a spin diffusion length. For example, the tunnel barrier 630 may have a sufficiently small thickness to generate a tunnel effect. In addition, the tunnel barrier 630 may include a non-magnetic material. According to some example embodiments, the tunnel barrier 630 may include at least one of an oxide of magnesium (Mg), titanium (Ti), aluminum (Al), magnesium-zinc (MgZn), and/or magnesium-boron (MgB), and/or a nitride of titanium (Ti) and/or vanadium (V). According to some example embodiments, the tunnel barrier 630 may include a magnesium oxide (MgO) film. In addition, the tunnel barrier 630 may include not only a single layer, but also a multiple layer. For example, the tunnel barrier 630 may be a layer in which magnesium (Mg) and magnesium oxide (MgO) are alternately stacked. The tunnel barrier 630 may have a predetermined (and/or otherwise desirable) crystal structure. For example, the tunnel barrier 630 may have a face-centered cubic lattice structure, such as a NaCl crystal structure.

The pinned magnetic layer 640 may be arranged under the tunnel barrier 630. The pinned magnetic layer 640 may have a fixed magnetization direction. Accordingly, the magnetization direction of the pinned magnetic layer 640 and the free magnetic layer 620 may be parallel or antiparallel to each other. When the pinned magnetic layer 640 and the free magnetic layer 620 are parallel to each other, the tunneling effect may occur well in the tunnel barrier 630, which may indicate a low resistance value, and in this case, a value (e.g., of '0') may be stored in terms of data, and when antiparallel, a high resistance value may be indicated because the tunneling effect does not occur well (e.g., is inhibited) in the tunnel barrier 630, and in this case, a value (e.g., of '1') may be stored in terms of data.

The pinned magnetic layer 640 may include, for example, a ferromagnetic material, such as Fe, Co, Ni, and/or an alloy thereof, and/or multilayer structures thereof. The pinned magnetic layer 640 may further include B, Cr, Pt, Pd, etc. For example, the pinned magnetic layer 640 may include at least one of NiFe, CoFe, NiFeB, CoFeB, NiFeSiB, and/or CoFeSiB.

Figure 7:
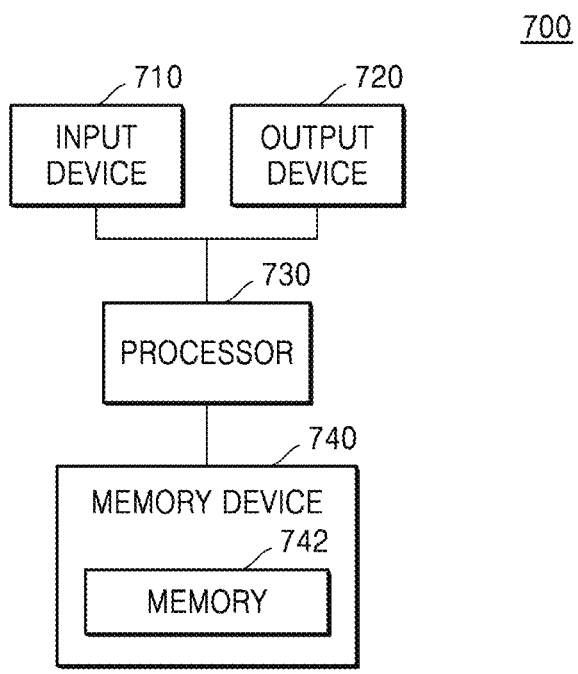
FIG. 7 is a block diagram of an electronic apparatus including a magnetic memory device according to some example embodiments.

FIG. 7 is a block diagram of an electronic apparatus 700 including a magnetic memory device according to some example embodiments.

Referring to FIG. 7, the electronic apparatus 700 includes an input device 710, an output device 720, a processor 730, and a memory device 740. In some embodiments, the memory device 740 may include a cell array including nonvolatile memory cells and/or peripheral circuits for operations of read, write, etc. In some other embodiments, the memory device 740 may include a nonvolatile memory device and a memory controller.

Memory 742 included in the memory device 740 may include a SOT structure and/or a magnetic memory device including the SOT structure according to the embodiments described with reference to FIGS. 1 to 6.

The processor 730 may be connected to the input device 710, the output device 720, and the memory device 740 through an interface (e.g., a bus), and may control the overall operation. The processor 730 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc.

The input device 710 may include a device, such as a touchpad, a keyboard, a mouse, a microphone, a camera, etc., and the output device 720 may include a device, such as a display, a speaker, a haptic feedback device, etc. Though illustrated as separate, the input device 710 and the output device 720 may, in some embodiments, include and/or be included in an input/output (I/O) device. For example, the I/O device may be a device for interfacing with an apparatus in which an input function and an output function are integrated into a single function, such as a touchscreen. Also, the I/O device may be a device for interfacing with an apparatus (e.g., a modem 820 of FIG. 8) connected to and/or included in a server (not shown).

Figure 8:
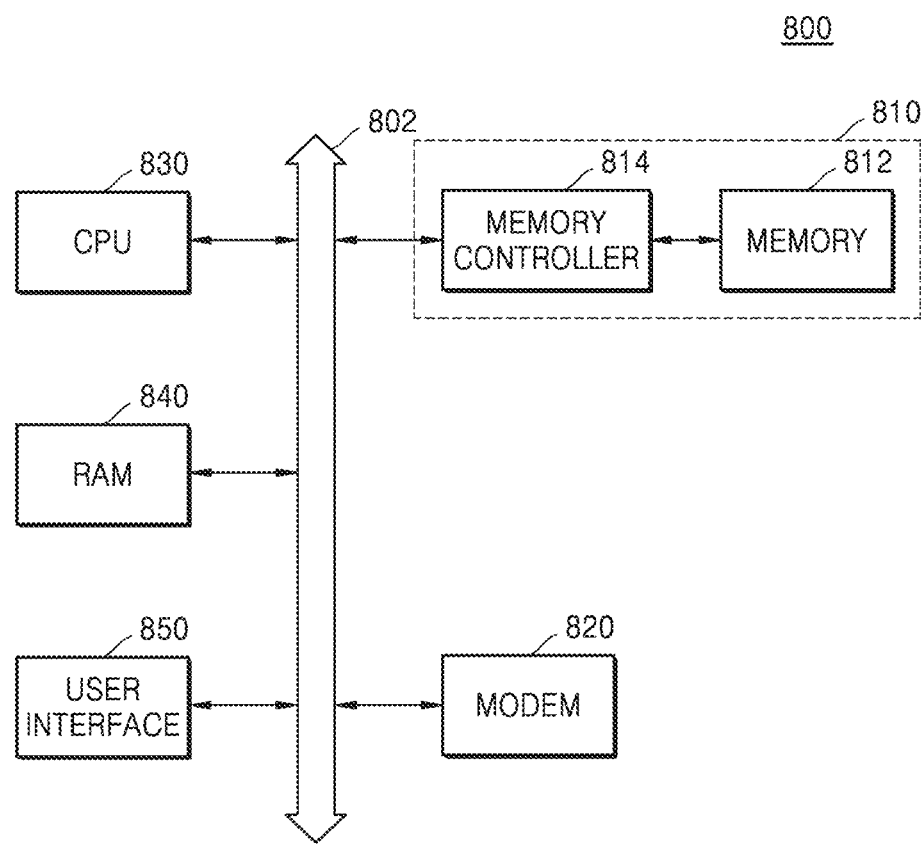
FIG. 8 is a block diagram of an information processing system including a magnetic memory device according to some example embodiments.

FIG. 8 is a block diagram of an information processing system 800 including a magnetic memory device according to some example embodiments.

Referring to FIG. 8, the information processing system 800 includes a nonvolatile memory system 810 electrically connected to a bus 802, a modem 820, a central processing unit 830, a RAM 840, and a user interface 850.

The nonvolatile memory system 810 may include a memory 812 and a memory controller 814. The memory controller 814 may control operations directed to and/or performed by the memory 812, and may include and/or be included in include processing circuitry such as hardware including logic circuits; a hardware/software combination such as a processor executing software; or a combination thereof. For example, the memory controller 814 may read data stored in the memory 812 or store data in the memory 812 in response to a read/write request. Data processed by the central processing unit 830 or data input from the outside are stored in the nonvolatile memory system 810.

The nonvolatile memory system 810 may include non-volatile memories, such as MRAM, PRAM, RRAM, and FRAM. At least one of the memory 812 and the RAM 840 may include a SOT structure or a magnetic memory device including the SOT structure according to the embodiments described with reference to FIGS. 1 to 6.

The information processing system 800 may be used in a portable computer, a web tablet, a wireless phone, a mobile phone, a digital music player, and a memory card, a MP3 player, a navigation, a portable multimedia player (PMP), a solid state disk (SSD), or household appliances.

The user interface 850 may be, for example, an input device, an output device, and/or an I/O device, as described above.

Figure 9:
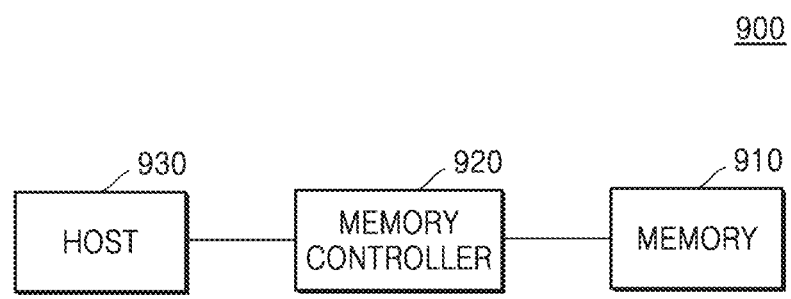
FIG. 9 is a block diagram of a memory card including a magnetic memory device according to some example embodiments.

FIG. 9 is a block diagram of a memory card 900 including a magnetic memory device according to some example embodiments.

The memory card 900 includes a memory 910 and a memory controller 920.

The memory card 900 may be connected to and/or be configured to receive instructions from a host 930.

The memory 910 may store data. In some embodiments, the memory 910 has a nonvolatile characteristic capable of maintaining stored data even when power supply is stopped. The memory 910 may include a SOT structure or a magnetic memory device including the SOT structure according to the embodiments described with reference to FIGS. 1 to 6.

The memory controller 920 may read data stored in the memory 910 or store data in the memory 910 in response to a read/write request from a host 930.

In some embodiments, a SOT structure having a high spin Hall angle and low resistance is provided by including a topological material and a ferromagnetic material matching with the topological material.

In some embodiments, a SOT structure having a low power consumption density is provided by including a topological material and a ferromagnetic material matching with the topological material.

In some embodiment, a magnetic memory device including the SOT structure is provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A spin-orbit torque structure comprising:
    an electrode layer including a two-dimensional topological material and configured to generate spin current; and
    a free magnetic layer in contact with the electrode layer, the free magnetic layer including a ferromagnetic material, and configured to be magnetically switched by receiving a spin-orbit torque by the spin current,
    wherein the two-dimensional topological material comprises a topological insulator (TI),
    wherein the ferromagnetic material comprises a stack of two-dimensional layers, and
    wherein an interface between the electrode layer and the free magnetic layer is atomically flat.

2. The spin-orbit torque structure of claim 1, wherein the topological insulator comprises at least one of $Bi_xSe_{1-x}Sb_yTe_{1-y}$ (BSTS), $Bi_2Te_2Se$ (BTS), or $Bi_2Se_2Te$ (BST).

3. The spin-orbit torque structure of claim 1, wherein the ferromagnetic material has a perpendicular magnetic anisotropy (PMA).

4. The spin-orbit torque structure of claim 1, wherein the ferromagnetic material has a Curie temperature in a range of 130 K to 330 K.

5. The spin-orbit torque structure of claim 1, wherein the ferromagnetic material comprises at least one of $Fe_3GeTe_2$ (FGT), CrGeTe (CGT), or CrSiTe (CST).

6. The spin-orbit torque structure of claim 1, wherein the spin-orbit torque structure has a spin Hall angle ($\theta_{SH}$) of 0.2 or more.

7. The spin-orbit torque structure of claim 1, wherein the spin-orbit torque structure has a power density of 20 $W/m^3$ or less.

8. The spin-orbit torque structure of claim 1, wherein the spin-orbit torque structure comprises only the two-dimensional topological material and the ferromagnetic material.

9. The spin-orbit torque structure of claim 1, wherein a critical switching charge current density at which the magnetization switching is performed is $10^7$ $A/cm^2$ or less.

10. The spin-orbit torque structure of claim 1, wherein the two-dimensional topological material comprises a stack of two-dimensional layers.

11. The spin-orbit torque structure of claim 1, wherein at least one of the two-dimensional topological material or the ferromagnetic material is a van der Waals (vdW) material.

12. The spin-orbit torque structure of claim 1, wherein the spin current is generated by a spin Hall effect.

13. The spin-orbit torque structure of claim 1, further comprising:
    a capping layer on the electrode layer.

14. A memory device comprising:
    the spin-orbit torque structure according to claim 1;
    a pinned magnetic layer; and
    a tunnel barrier between the free magnetic layer of the spin-orbit torque structure and the pinned magnetic layer,
    wherein the memory device is configured to change magnetoresistance according to the magnetization switching of the free magnetic layer.

15. The memory device of claim 14, wherein the memory device is configured to have conductance across the tunnel barrier when a magnetization direction of the free magnetic layer is parallel to a fixed magnetization direction of the pinned magnetic layer.

16. The memory device of claim 14, wherein the memory device is configured to have resistance across the tunnel barrier when a magnetization direction of the free magnetic layer is antiparallel to a fixed magnetization direction of the pinned magnetic layer.

17. The memory device of claim 14, wherein the tunnel barrier comprises an oxide of at least one of magnesium (Mg), titanium (Ti), aluminum (Al), magnesium oxide (MgO), magnesium-zinc (MgZn), and magnesium-boron (MgB), and a nitride of titanium (Ti) or vanadium (V).

18. The memory device of claim 14, wherein the pinned magnetic layer comprises at least one of Fe, Co, Ni, or an alloy thereof.

19. The memory device of claim 18, wherein the pinned magnetic layer comprises at least one of NiFe, CoFe, NiFeB, CoFeB, NiFeSiB or CoFeSiB.

20. An electronic apparatus comprising the memory device of claim 14.

* * * * *